United States Patent
Liaw

(10) Patent No.: US 9,147,606 B2
(45) Date of Patent: Sep. 29, 2015

(54) ROM CHIP MANUFACTURING STRUCTURES

(71) Applicant: Taiwan Semiconductor Manufacturing Company, Ltd., Hsin-Chu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/938,776

(22) Filed: Jul. 10, 2013

(65) Prior Publication Data

US 2015/0016173 A1   Jan. 15, 2015

(51) Int. Cl.
*G11C 17/00* (2006.01)
*H01L 21/768* (2006.01)
*G11C 5/06* (2006.01)
*G11C 17/08* (2006.01)

(52) U.S. Cl.
CPC .......... *H01L 21/76895* (2013.01); *G11C 5/063* (2013.01); *G11C 17/08* (2013.01)

(58) Field of Classification Search
USPC .................................................. 365/94, 104
See application file for complete search history.

(56) References Cited

U.S. PATENT DOCUMENTS

| | | | |
|---|---|---|---|
| 7,863,136 B2 * | 1/2011 | Goldbach et al. | 438/270 |
| 7,920,403 B2 | 4/2011 | Liaw | |
| 8,212,295 B2 | 7/2012 | Liaw | |
| 2003/0071298 A1 * | 4/2003 | Takahashi | 257/298 |
| 2007/0072437 A1 * | 3/2007 | Brennan et al. | 438/761 |
| 2008/0170426 A1 * | 7/2008 | Liaw | 365/104 |

* cited by examiner

*Primary Examiner* — Hoai V Ho
(74) *Attorney, Agent, or Firm* — Slater & Matsil, L.L.P.

(57) ABSTRACT

An integrated circuit (IC) chip embodiment includes first and second ROM cells arranged in a same row of a ROM array. The first and second ROM cells include first portions of first and second gate structures, respectively. The IC chip further includes a strap cell disposed between the first and second ROM cells. The strap cell includes second portions of the first and second gate structures. The first gate structure is physically separated from the second gate structure.

20 Claims, 16 Drawing Sheets

ROM CHIP MANUFACTURING STRUCTURES

BACKGROUND

Read only memory (ROM) arrays are semiconductor memory chip arrays with data permanently stored in the array. ROM arrays are made up of a plurality of ROM cells, each ROM cell includes a single transistor in an "on" or "off" state. Whether the transistor is in an "on" or "off" state depends on the inclusion of contact vias connecting an active region (e.g., source/drain region) of the transistor to Vss.

Fin field-effect transistors (FinFET) are often used in ROM cells due to better drive current characteristics and sub-threshold leakage/matching performance compared to traditional transistors. In a finFET, a gate is formed to wrap around a vertical fin structure in the vertical direction. A finFET gate electrode does not have a uniform thickness. For example, a portion of the gate electrode directly over a fin will be less thick than other portions of the gate electrode because the gate is configured to wrap around the fin. Furthermore, a planarization, e.g., chemical mechanical polish (CMP), is generally performed to remove excess gate electrode material. As a result of the planarization, the thickness of the gate electrode may vary depending on the length of the gate (e.g., thickness variation may increase as length increases).

In a ROM array, a single gate structure is typically shared by all the ROM cells in a roll. Therefore, a large ROM array (e.g., 256 cells long) may have longer gates than smaller ROM arrays (e.g., 64 cells long). Furthermore, a ROM chip may include several different ROM arrays of varying sizes. Therefore, the gates electrodes of these different ROM arrays may have varying thicknesses. Variation in gate electrode thickness may create different voltage/current characteristics (e.g., $V_t/I_{on}$) in differently sized ROM arrays of a chip, negatively affecting ROM chip performance.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a read only memory (ROM) cell array having fin field effect transistors (finFET). Other embodiments may also be applied, however, to other circuits such as static random-access memory (SRAM) circuits or logic circuits.

Figure 1:
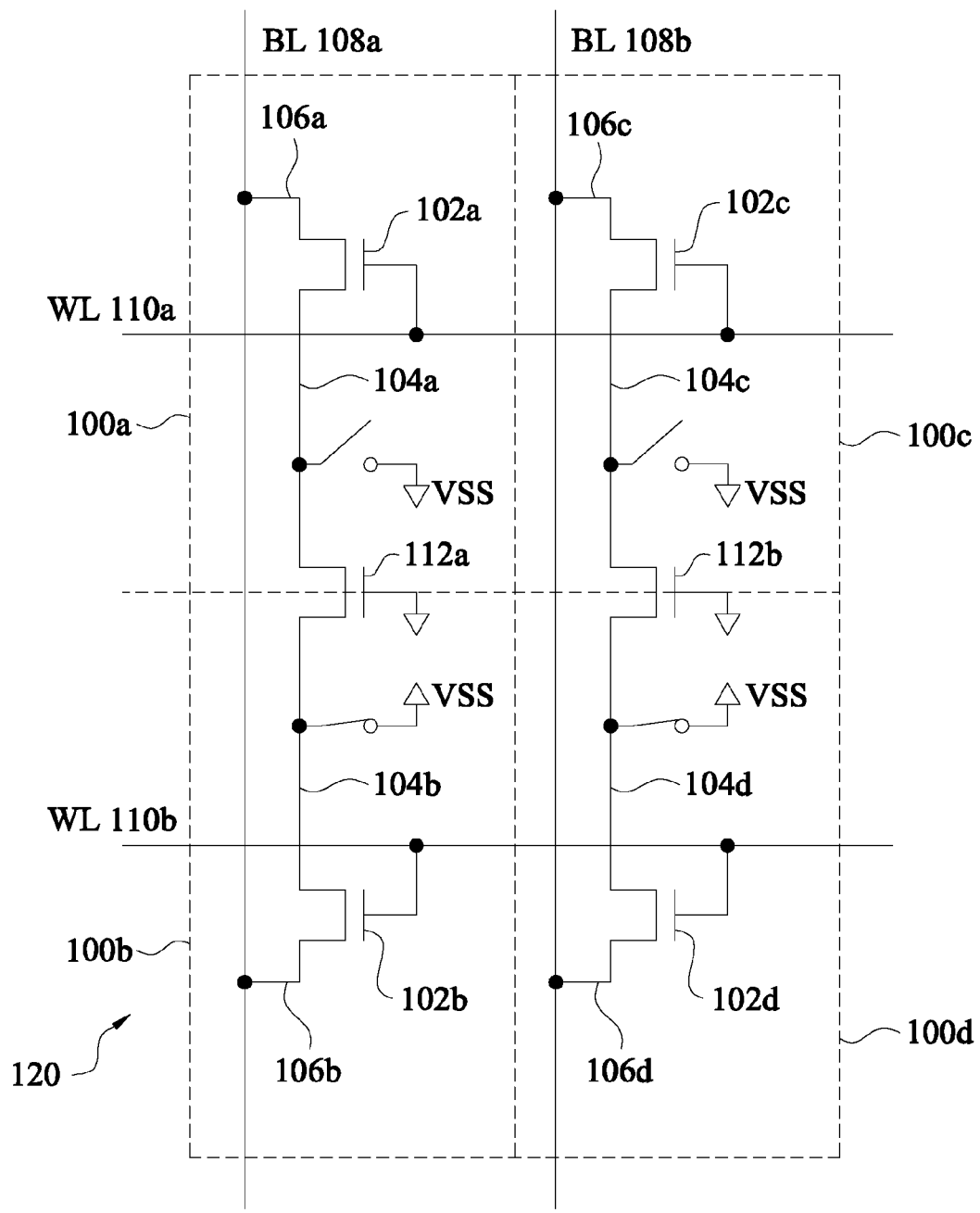
FIG. 1 is a circuit diagram of a ROM array according to various embodiments.

With reference now to FIG. 1, there is shown a circuit diagram of a ROM array 120. ROM array 120 includes a plurality of ROM cells 100 (labeled 100a-100d). ROM cells 100 may also be referred to as ROM bit cells 100. Only a 2×2 (four cell) portion of ROM array 120 is illustrated in FIG. 1. However, ROM array 120 may be much larger having, for example, 4×4, 8×8, 16×16, 32×32, 64×64, 128×128, 256×256, 512×512, or more ROM cells.

Each ROM cell 100 includes a pass transistor (alternatively referred to as a pass device) having a gate 102 (labeled 102a-102d) connected to a word line 110. ROM cells in the same row share a common word line. For example, gates 102a and 102c of ROM cells 100a and 100c, respectively, are both connected to word line 110a. Similarly, gates 102b and 102d of ROM cells 100b and 100d, respectively, are both connected to word line 110b. Although gates 102a and 102c are electrically connected to a common word line, gates 102a and 102c may or may not share the same physical gate structure. Rather, ROM cells 100 (e.g., ROM cell 100a and 100c) in the same ROM array row share gate structures, which are physically separated at regular intervals. For example, every four, six, eight, sixteen, thirty-two, or sixty-four adjacent ROM cells in the same row share a gate structure, which is physically separated from the other gate structures in the row. These physically separated gate structures in each row are electrically connected using strap cells with connection modules to a common word line 110. Thus, the gate lengths in ROM array 120 and in a ROM chip may be substantially uniform and kept relatively short, having stable voltage/current characteristics. Furthermore, the layout of electrically connecting various physically separated gates using strap cells may take into consideration a maximum acceptable resistance level of various elements in ROM array 120.

Each ROM cell 100 further includes active regions, source/drains 104/106 (labeled as 104a/106a-104d/106d). Sources 104 may or may not be connected to $V_{ss}$. $V_{ss}$ serves as ROM cell voltage (e.g., ground) supply lines. Whether or not a ROM cell is in a logical "0" or "1" state depends on whether source 104 is or is not connected to $V_{ss}$. For example, FIG. 1 illustrates ROM cells 100a and 100c are configured in a logical state "0", whereas ROM cells 100b and 100d are configured in a logical state "1". The definition of logical state "0" and logical state "1" may be reversed in alternative applications of various embodiments.

Drains 106 are connected to bit lines 108. ROM cells in the same column share a common bit line. For example, drains 106a and 106b of ROM cells 100a and 100b, respectively, are connected to the same bit line 108a. Similarly, drains 106c and 106d of ROM cells 100c and 100d, respectively, are connected to bit line 108b. Each ROM cell 100 is read by asserting the word line 110 and reading the bit line 108 associated with the cell. For example, ROM cell 100a is read by asserting word line 110a and reading bit line 108a (i.e., to determine there is no connection path from bit line 108a to $V_{ss}$ through source 104a).

Furthermore, ROM array 120 includes isolation devices 112 (labeled as 112a and 112b) disposed between adjacent ROM cells 100 in the same column. Gates of isolation devices 112 are permanently connected to ground potential, and are thus permanently in a turn-off state and may not perform any electrical functions other than isolation. Isolation devices 112 are used to separate and electrically isolate active regions (e.g., source 104) of adjacent ROM cells in a column (e.g., ROM cells 100a and 100b). Isolation devices 112 prevent active current from flowing between two adjacent ROM cells (e.g., ROM cells 100a and 100b) so that two adjacent ROM cells may share a continuous active region.

While FIG. 1 illustrates ROM cells 100 in a particular kind of configuration for storing logical states "0" and "1", any suitable alternative configuration for ROM cells 100 may apply. For example, sources 104 may be connected to $V_{ss}$ regardless of the desired logical state of ROM cell 100. Whether a ROM cell 100 is in logical state "0" or "1" may depend on whether or not a connection exists between drain 106 and bit line 108.

Figure 2:
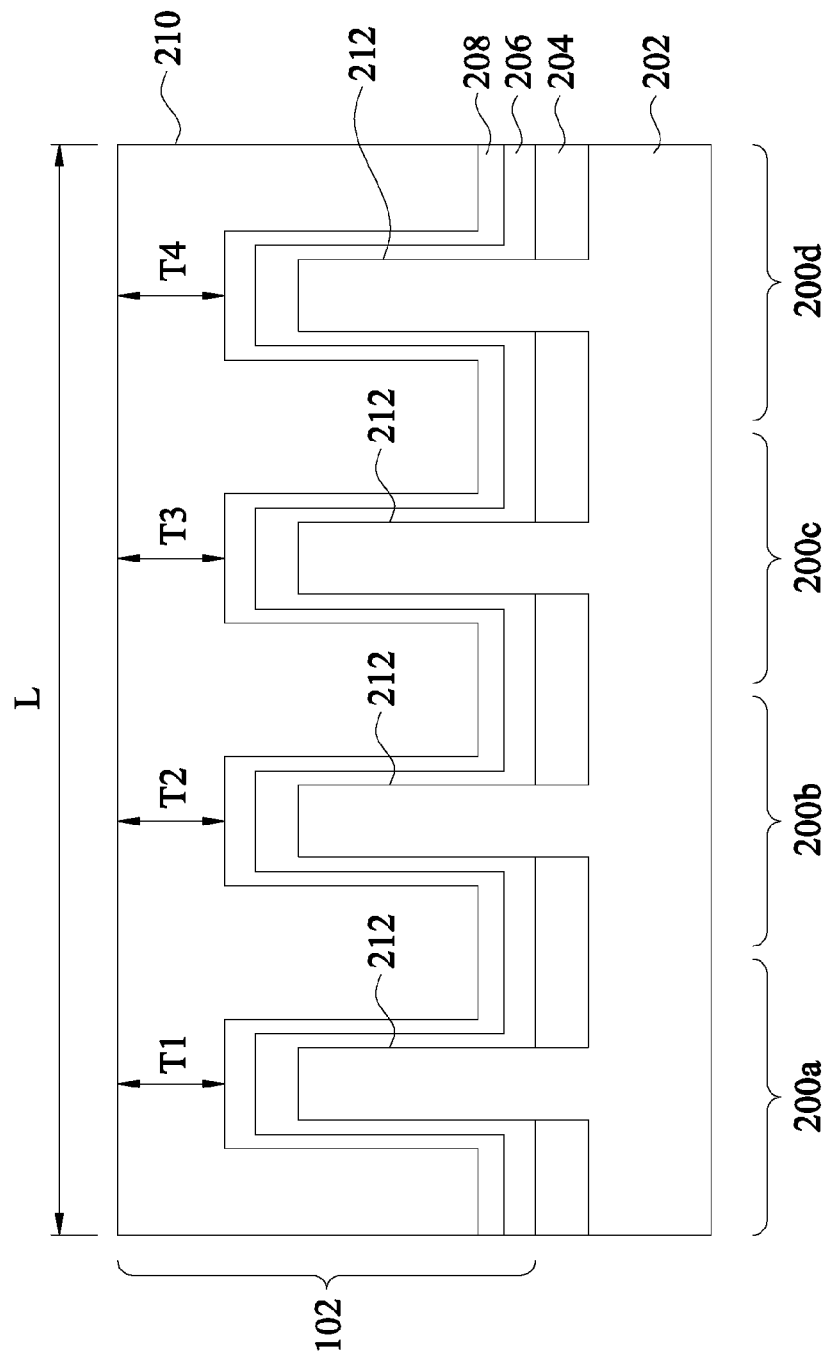
FIG. 2 is a cross-sectional view of a finFET according to various embodiments.

FIG. 2 illustrates cross-sectional view of multiple finFETs 200 (labeled 200a-200d) according to various embodiments. FinFETs 200 includes a substrate 202. Substrate 202 may be a bulk substrate formed of silicon, although other materials such as group III, group IV, and or group V elements, such as germanium, gallium, arsenic, and combinations thereof maybe used as well. Alternatively, substrate 202 may be a silicon-on-insulator (SOI) substrate with a base silicon layer and a SOI layer over the base silicon layer.

Fins 212 (also referred to as active region 212) extend upwards out of substrate 202. Fins 212 include a drain, a source and a channel region connecting the drain and the source. Fins 212 may be formed by patterning substrate 202, e.g., using a combination of photolithography and etching techniques. Alternatively, fins 212 may be formed by depositing an oxide layer (e.g., silicon oxide) over substrate 202, patterning the oxide layer, and epitaxially growing fins. In FIG. 2, each fin 212 marks a separate finFET 200a, 200b, 200c, and 200d. However, each finFET 200 may have two, three, or more fins depending on the desired electrical characteristics.

A gate 102 of finFET 200 is disposed over substrate 202 and fins 212. An isolation layer 204 (e.g., silicon oxide) may be disposed between gate 102 and substrate 202. Gate 102 wraps around active region 212 on three surfaces like an upside-down U. In FIG. 2 illustrates finFETs 200 share gate 102, and finFETs 200 may be disposed in a same ROM array row.

Gate 102 may include a gate dielectric 206 and a work function metal 208 over fin 212. Gate dielectric 206 may be formed of a high-k dielectric material (e.g., hafnium oxynitride, tantalum pentoxide, aluminum oxide, or the like), having a k value greater than about 7.0. Alternatively, gate dielectric 206 could be silicon dioxide. Work function metal 208 comprises, for example, TiN, TaN, TiAl, TaAl, titanium, tantalum, aluminum, tungsten, TiSi, NiSi, PtSi, or the like. Gate dielectric 206 and work function metal 208 may be formed using any suitable technique such as chemical vapor disposition (CVD). FinFET 200 may have a device work function within a range of about 4 eV to about 5 eV. Work function metal 208 is included to induce a charge in the channel region of fin 212 when an appropriate bias voltage is applied to finFET 200 (e.g., when a word line (not shown) is asserted). A gate electrode 210 is formed over fin 212 and work function metal 208. Gate electrode 210 may comprise, for example, aluminum, copper, tungsten, titanium, tantalum, nitrogen, refractory materials (e.g., TiN, TaN, TiW, or TiAl), polysilicon comprising silicide, or the like. A planarization technique (e.g., CMP) may be performed to level a top surface of gate electrode 210.

As illustrated by FIG. 2, gate electrode 210 may not have a uniform thickness. That is, thicknesses T1, T2, T3, and T4 may vary depending on an overall length L of gate 102. Thickness variations of gate electrode 210 may create variations in voltage/current characteristics (e.g., $V_t/I_{off}$) of finFET 200. Various embodiments configure the gates of pass devices in ROM array 120 to have a constant overall gate length L, creating greater stability for ROM array 120's voltage/current characteristics. Furthermore, all ROM arrays of a ROM chip (not shown) may have finFETs with constant gate lengths L, advantageously stabilizing the voltage/current characteristics of ROM cells in the ROM chip.

Figure 3A:
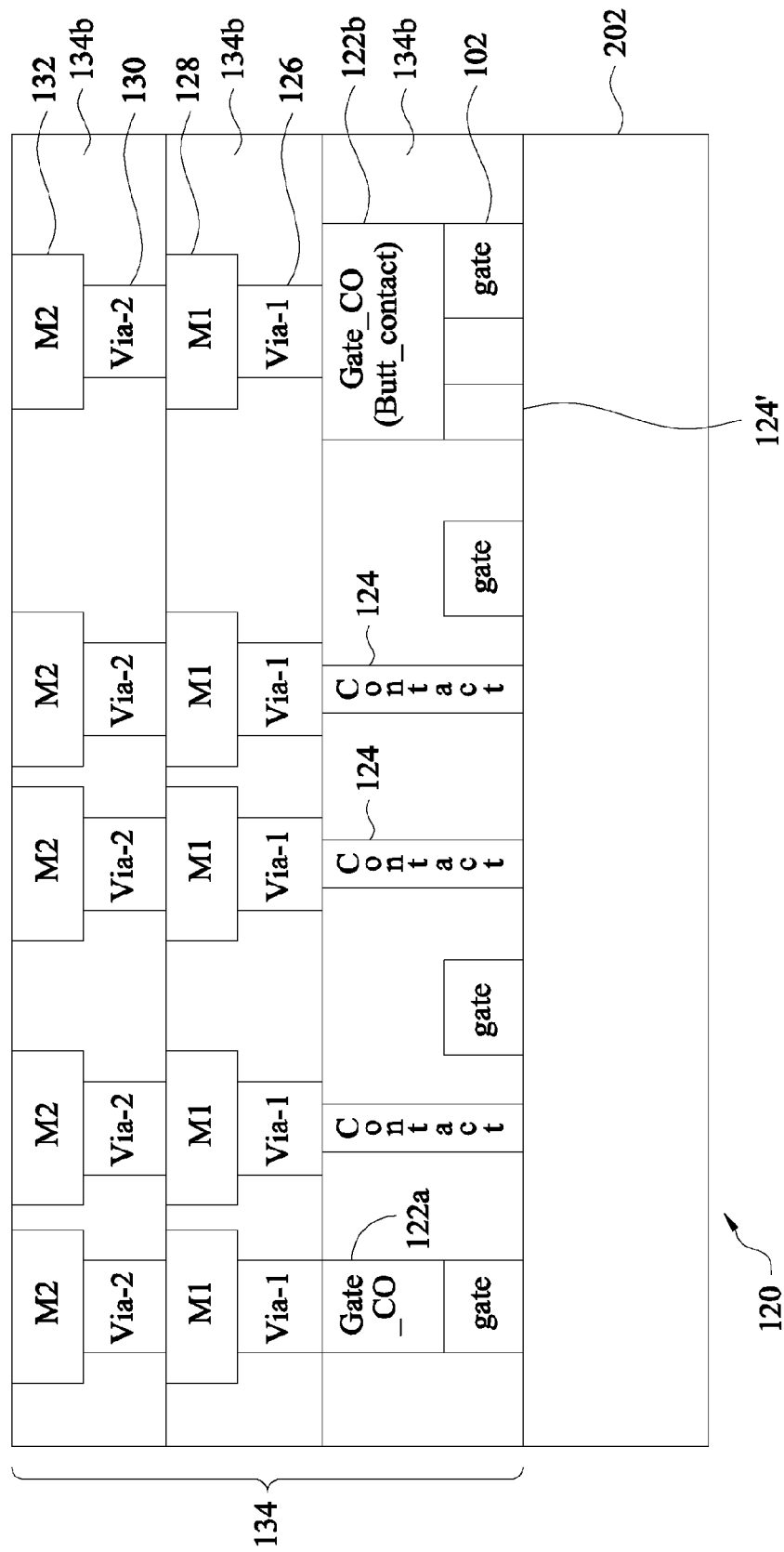
FIGS. 3A-3C are varying views views of ROM arrays according to various embodiments.
Figure 3B:
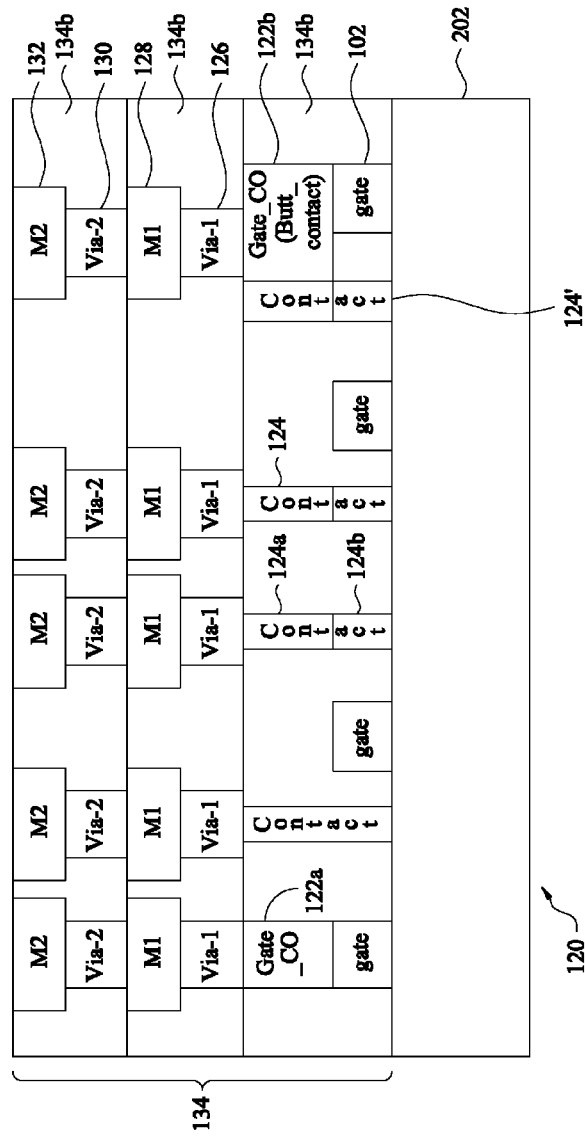

FIGS. 3A and 3B illustrate cross-sectional view of a semiconductor device (e.g., ROM array 120) in accordance with various embodiments. FIGS. 3A and 3B illustrate various possible components and their respectively vertical relationships in ROM array 120; however, FIGS. 3A and 3B may not accurately portray the actual lateral positioning of components in ROM array 120. ROM array 120 includes substrate 202 and a plurality of finFET transistors 200 (not shown) formed in substrate 202. As previously discussed, a gate 102 is formed over substrate 202 and may wrap around portions of active regions (not shown) of finFET transistors 200. An interconnect structure 134 is formed over gates 102 and substrate 202.

Interconnect structure 134 includes an inter-layer dielectric (ILD) 134a over substrate 202. ILD 134a may comprise a material such as any suitable low-k dielectric material (e.g., having a k-value less than about 2.8) may be used for ILD 134a. ILD 134a may be formed using a process such as plasma-enhanced CVD, although other processes, such as low pressure CVD, may alternatively be used.

ILD 134a may include gate contacts 122 and source/drain contacts 124 electrically connected to gates 102 and active regions (not shown), respectively. Contacts 122 and 124 may be formed in ILD 134a using any suitable method. For example, a combination of photolithography and etching techniques may be applied to pattern ILD 134a, forming a plurality of openings. These openings may then be filled with conductive materials (e.g., tungsten) to form contacts 122 and 124. Alternatively, contacts 122 and 124 may comprise Cu, Al, AlCu, TiN, TiW, Ti, TaN, Ta, Pt, or any combination thereof. Furthermore, contacts 122 and 124 may further include a barrier/adhesion layer (not shown) to prevent the diffusion of metallic material in the surrounding dielectric layer and provide better adhesion. The barrier layers may be formed of one or more layers of titanium, titanium nitride, tantalum, tantalum nitride, or the like using any suitable method such as CVD. Gate contacts 122 may include butted contacts 122b, which may, for example, in certain alternative embodiments (e.g., a SRAM array) be used to electrically connect gates 102 to an active region. However, various embodiments may be substantially free of such butted contacts 122b when gates 102 are not electrically tied to active regions.

Contacts 122 and 124 may be formed in separate process steps. Furthermore, source/drain contacts 124 may be formed in a single process step (as shown in FIG. 3A) or in two process steps (as shown in FIG. 3B). In the embodiments illustrated by FIG. 3B, the second portion of contact plug 124 (i.e., 124a) may be formed in the same process step as the formation of gate contact 122.

For example, as illustrated by FIG. 3B, a patterning process (e.g., photolithography and etching) may be performed to create applicable openings for source/drain contacts 124b. Subsequently, in a separate step, a patterning process (e.g., photolithography and etching) may be performed to create applicable openings for source/drain contacts 124a. Yet another separate process step, a patterning process (e.g., photolithography and etching) may be performed to create applicable openings for gate contacts 122a/122b. The patterning of gate contacts 122a and 122b may be done in the same or separate process steps. Various openings may then be filled with a suitable metallic material (e.g., tungsten, copper, or the like) in the same or separate process steps. For example the filling of source/drain contacts 124a/124b and gate contacts 122a/122b may be done in the same process step. Alternatively, the filling of source/drain contacts 124b may be done separately from, the filling of contacts 124a and 122a/122b. Furthermore, contacts 122a/122b and 124a/124b may or may not include a diffusion barrier layer formed of a suitable material (e.g., TiN, TaN, or the like).

Interconnect structure 134 also includes a plurality of inter-metal dielectric (IMD) layers 134b. FIGS. 3A and 3B illustrate two IMDs 134b, but any number of IMDs may be used. IMDs 134b include first-level vias 126, first-level metal lines 128, second-level vias 130, and second-level metal lines 132, electrically connected together. Vias 126/130 and metal lines 128/132 are formed of conductive materials (e.g., copper, copper aluminum, aluminum alloys, copper alloys, or the like) using any suitable methods (e.g., photolithography, etching, and filling with a metallic material). First-level metal lines 128 may include bit lines 108 and first level $V_{ss}$ lines. First-level metal lines 128 may also be included for electrical routing purposes for connecting to second-level metal lines 132. Second-level metal lines 132 may include word lines 110 and second-level $V_{ss}$ lines.

Figure 3C:
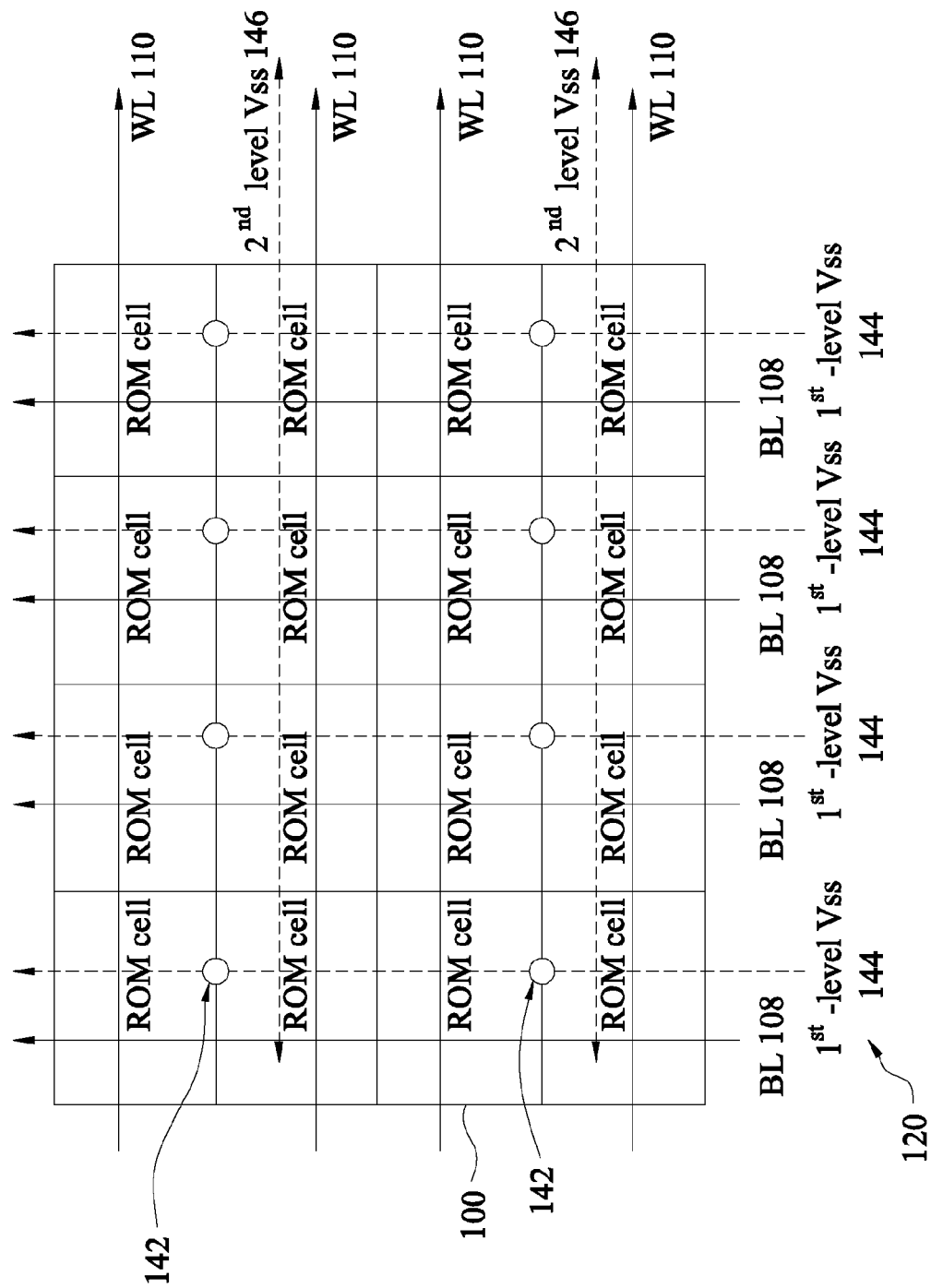

First-level and second level $V_{ss}$ lines may run in perpendicular directions in ROM array 120. For example, FIG. 3C illustrates a top down view of ROM array 120 having ROM cells 100. First-level $V_{ss}$ lines 144 and second-level $V_{ss}$ lines 146 are configured orthogonal directions to each other. That is, first-level $V_{ss}$ lines 144 run parallel to bit lines 108, and second-level $V_{ss}$ lines 146 run parallel to word lines 110. Furthermore, bit lines 108 and word lines 110 may also run in perpendicular directions with respect to each other. Contacts 142, which may be second-level vias 130, electrically connect various first-level $V_{ss}$ lines 144 and second-level $V_{ss}$ lines 146 together.

Figure 4A:
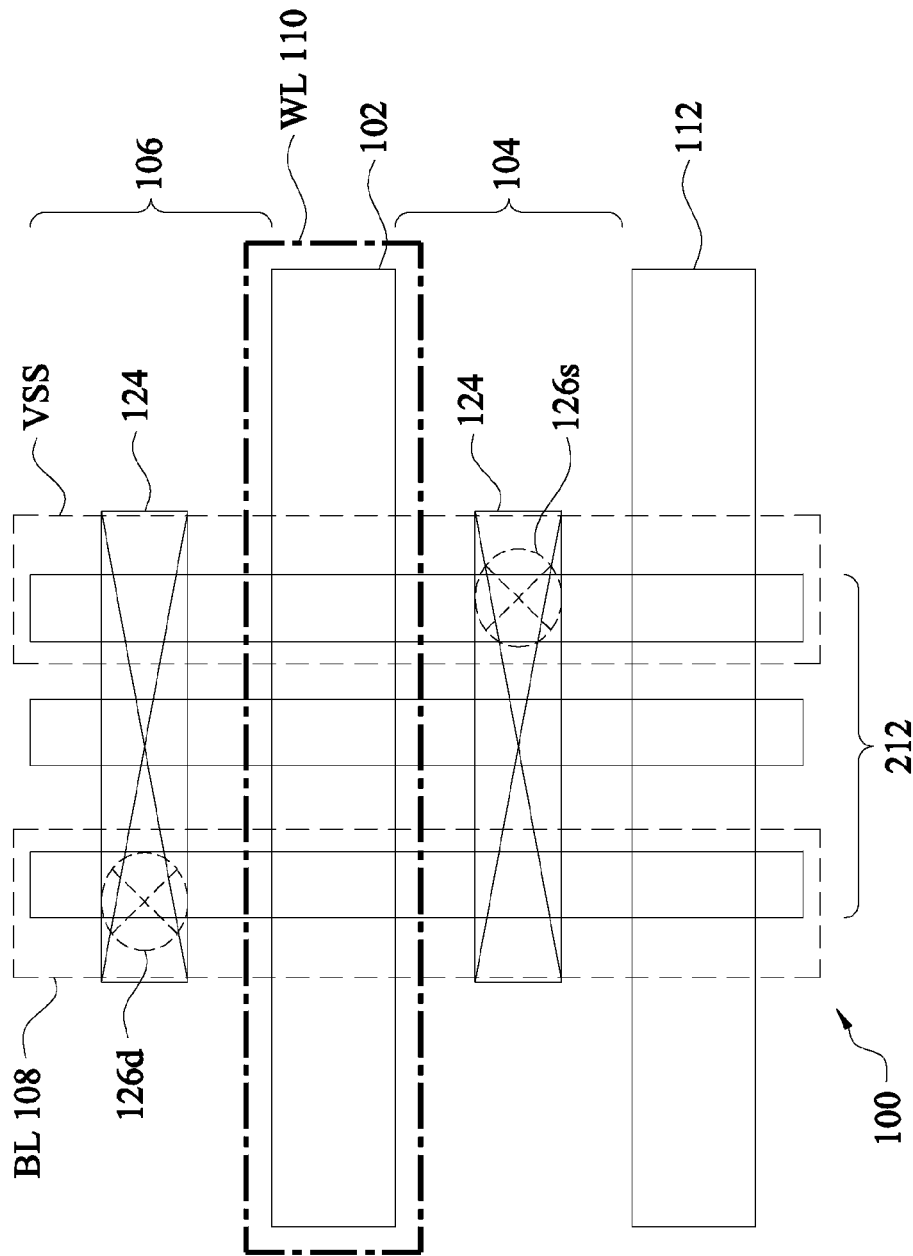
FIGS. 4A and 4B are top down views of a ROM cell according to various embodiments.
Figure 4B:
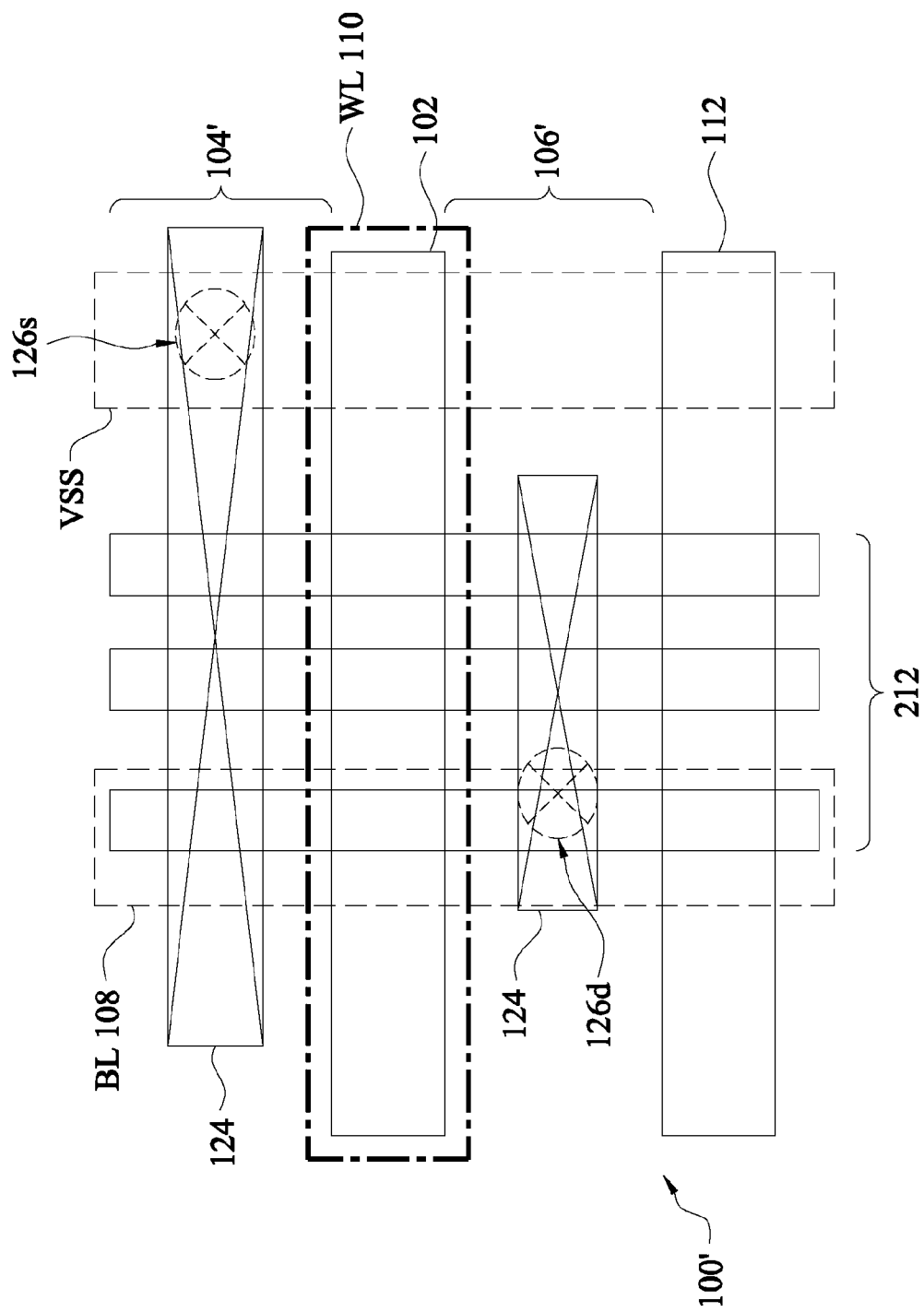

FIGS. 4A and 4B illustrate top-down views of two alternative configurations of ROM cells 100 and 100' in accordance with various embodiments. Various aspects of ROM cells 100 and 100' may be shown in-ghost, and may not be readily visible looking down on ROM cells 100 and 100'. ROM cells 100 and 100' include gates 102 and a plurality of fins 212. Gates 102 may be connected to word line 110 (illustrated by a dotted-lined box) at a portion of ROM array 120 outside of ROM cell 100 (not shown). The exact number of fins 212 depends on the desired electrical performance of ROM cells 100 and 100'. Fins 212 create active regions (e.g., sources 104 and drains 106) on either side of gates 102. Source/drain contacts 124 are included in ROM cells 100 and 100' to provide electrical contacts to sources 104 and drains 106. First-level vias 126s may or may not electrically connect source contacts 124 to $V_{ss}$, which may be a first-level metal line 128. First level vias 126d may or may not electrically connect drain contacts 124 to bit line 108, which may also be a first-level metal line 128. ROM cells 100 and 100' further include an isolation device 112, which may include a gate of a finFET transistor. In certain embodiments (e.g., FIG. 4A), the presence or absence of vias 126s connecting source contact 124 to $V_{ss}$ may determine whether ROM cell 100 is in a "0" or "1" logical state. In alternative embodiments (e.g., FIG. 4B), the presence or absence of vias 126d connecting drain contact 124 to bit line 108 may determine whether ROM cell 100' is in a "0" or "1" logical state.

Figure 5A:
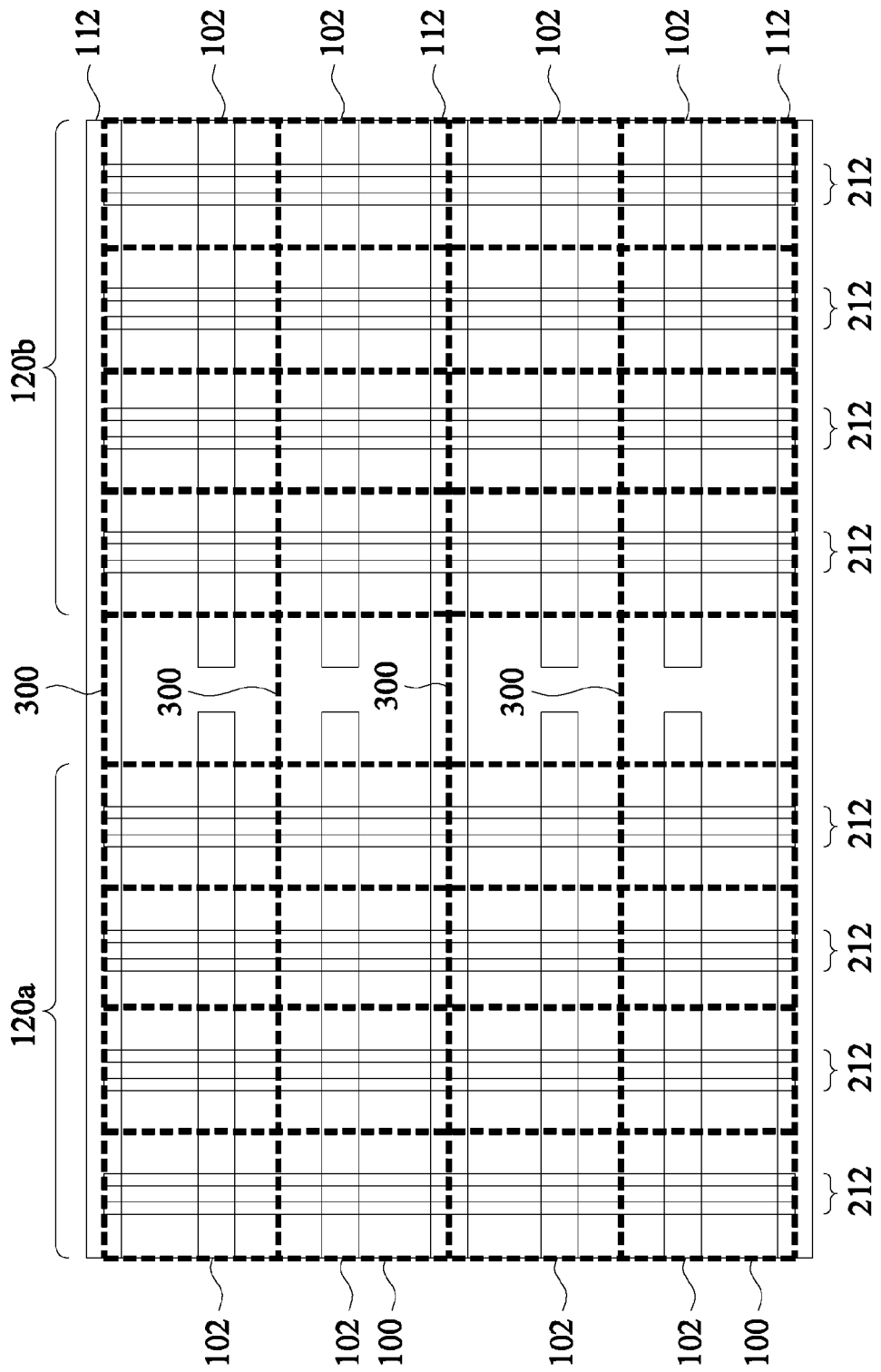
FIGS. 5A-5E are varying views of a ROM array according to various embodiments.

FIGS. 5A-5E illustrate varying views of a ROM array 120 in accordance with various embodiments. As shown in FIG. 5A, ROM array 120 is broken up at regular intervals into portions 120a and 120b. ROM array portions 120a and 120b each comprises 4×4 (i.e., sixteen) ROM cells 100, wherein a common gate 102 is shared by ROM cells 100 in the same row for each ROM array portion 120a and 120b. Each ROM cell 100 includes a portion of a gate 102, a portion of fins 212, and a portion of an isolation device 112. An isolation device 112 may be disposed between every two gates 102.

Gates 102 do not extend between ROM array portions 120a and 120b. That is, gates of ROM array portion 120a are physically separated from gates of ROM array portion 120b. Strap cells 300 are disposed between ROM array portion 120a and ROM array portion 120b. Strap cells 300 include connector modules (see, e.g., modules 302 in FIG. 5B) that electrically connect gates 102 in the same ROM array row to a common word line. Therefore, while gates 102 in the same ROM array role may be physically separated, gates 102 may still be electrically connected together.

In ROM array 120, gates 102 are physically separated at regular length intervals. While ROM array portions 120a and 120b are illustrated as being four ROM cells in length, various alternative embodiments may include ROM array portions 120a and 120b being 8, 16, 32, 64, or more ROM cells in length, having continuous gates 102 spanning the, 16, 32, 64, or more ROM cells. The length of ROM array portions may be constant in a ROM chip having multiple other ROM arrays (not shown) in addition to ROM array 120. Thus, gate lengths (and gate thicknesses) of various ROM arrays are relatively uniform and do not depend on the overall size of the ROM array. This configuration allows for the voltage/current characteristics of ROM cells in the ROM chip to be relatively stable.

Gates of isolation devices 112 may not be physically separated at regular intervals. Alternatively, gates of isolation devices 112 may be physically separated at different and/or less-frequent intervals than gates 102 of ROM cells 100. As previously discussed, gates of isolation devices 112 may be electrically connected to ground potential and be in a permanent turn-off state. Thus, isolation devices 112 may be more tolerant of variations in voltage/current characteristics of its finFET transistors.

Figure 5B:
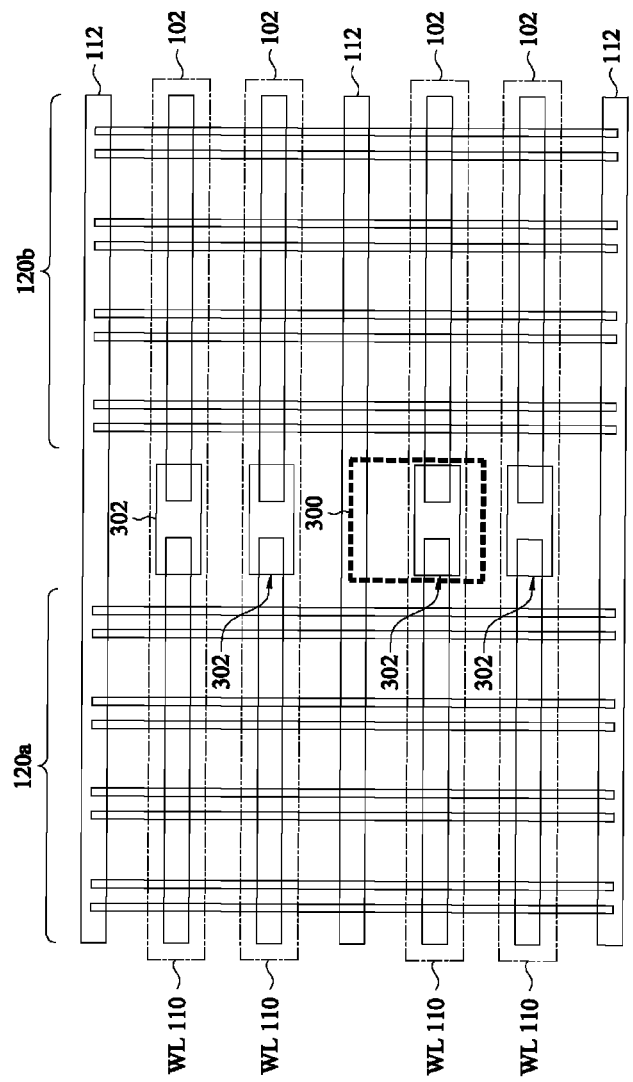

FIG. 5B illustrates a top down view of ROM array 120 in accordance with various embodiments. FIG. 5B illustrates additional features of ROM array 120 compared to FIG. 5A. The dotted-lined boxes used to delineate ROM cell 100 boundaries and many strap cell 300 boundaries in FIG. 5A are removed for ease of illustration. A plurality of word lines 110 (illustrated by dotted-lined boxes) runs over and parallel to gates 102. Word lines 110 may be second level metal lines 132 of FIGS. 3A and 3B.

A plurality of strap cells 300 is disposed between ROM array portion 120a and ROM array portion 120b. Each strap cell 300 includes portions of two physically isolated gates 102 from ROM array portion 120a and ROM array portion 120b, respectively. Strap cells 300 include a connection module 302, which electrically connects the physically separated gates 102 in the same ROM array row to each other and a common word line 110.

Figure 5C:
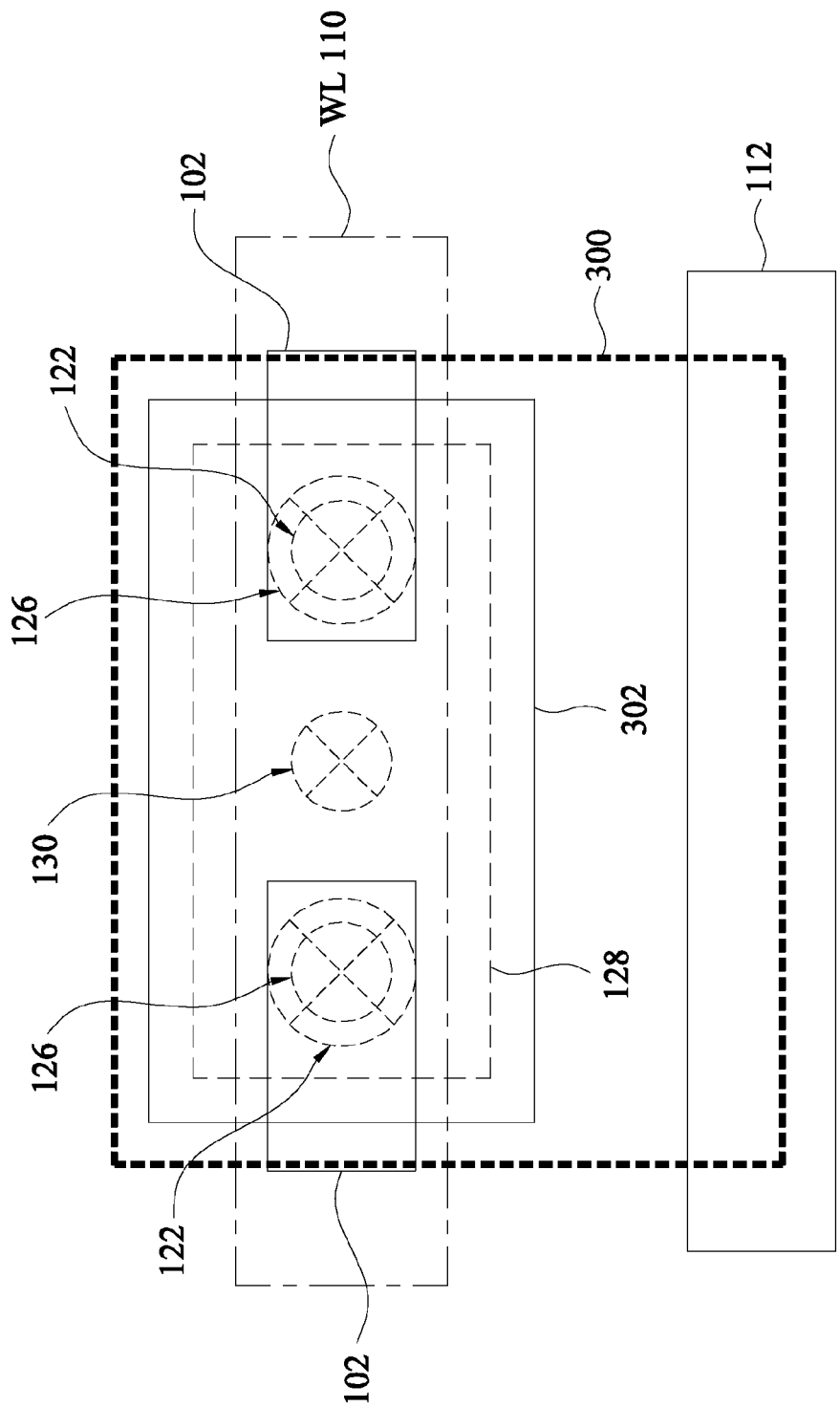

Connection modules 302 may be configured in any suitable layout for electrically connecting physically separated gates 102 to a common word line 110. For example, FIG. 5C illustrates a top-down, detailed view of strap cell 300 in accordance with various embodiments. Strap cell 300 includes physically isolated gates 102 in the same ROM array row, a connection module 302, a common word line 110 over gates 102, and a portion of isolation device 112. Notably, the portion of isolation device 112 may include a continuous gate structure.

Connection module 302 electrically connects gates 102 to word line 110. Connection module 302 includes a gate contact 122 and a first-level via 126 electrically connected to each gate 102. The two gate contacts 122 and two first-level vias 126 are electrically connected to a single first-level metal line 128. A second-level via 130 is disposed between the two physically separate gates 102 and electrically connects first-level metal line 128 to word line 110. Word line 110 may be a second-level metal line 132 of FIGS. 3A and 3B.

Figure 5D:
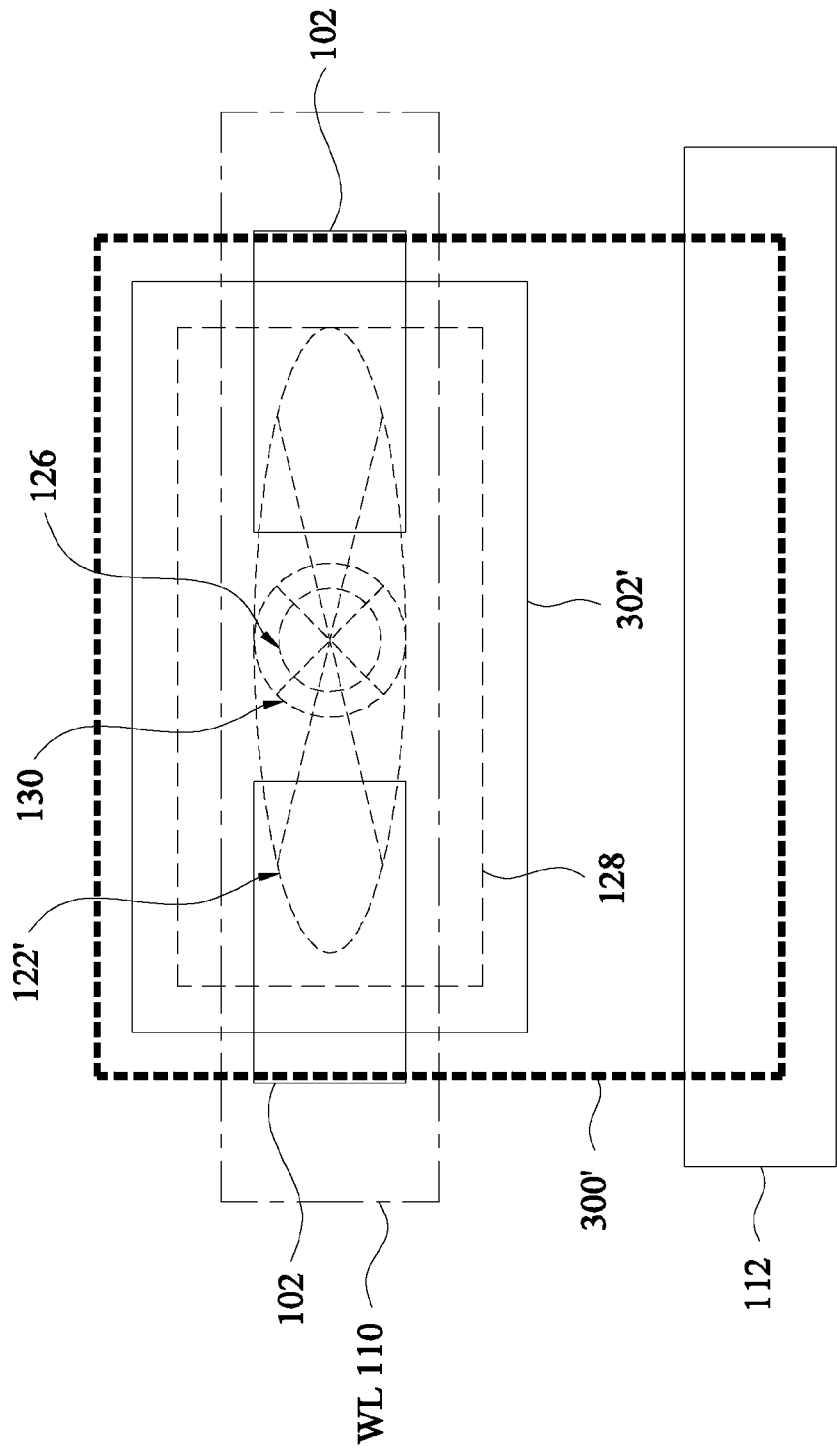

As another example, FIG. 5D illustrates a top-down, detailed view of strap cell 300 in accordance with various alternative embodiments. Strap cell 300 includes physically isolated gates 102 in the same ROM array row, a connection module 302', a common word line 110 over gates 102, and a portion of isolation device 112. Notably, the portion of isolation device 112 may include a continuous gate structure.

Connection module 302' electrically connects gates 102 to word line 110. Connection module 302' includes a single, extended gate contact 122' that is electrically connected to both physically separated gates 102. A first end of expanded gate contact 122' is connected to one of the gates 102 and a second end of expanded gate contact 122' is connected to the other of the gates 102. A singe first-level via 126 is electrically connected gate contact 122'. Gate contact 122' and first-level via 126 are electrically connected to a first-level metal line 128. A second-level via 130 is disposed between the two physically separate gates 102 and electrically connects first-level metal line 128 to word line 110. Word line 110 may be a second-level metal line 132 of FIGS. 3A and 3B.

While FIGS. 5C and 5D illustrate vias 126 and 130 as being vertically aligned, this is not necessary. One skill in the art would recognize that vias 126 and 130 may also be arranged to be laterally spaced from one another without departing from the scope of various embodiments.

Figure 5E:
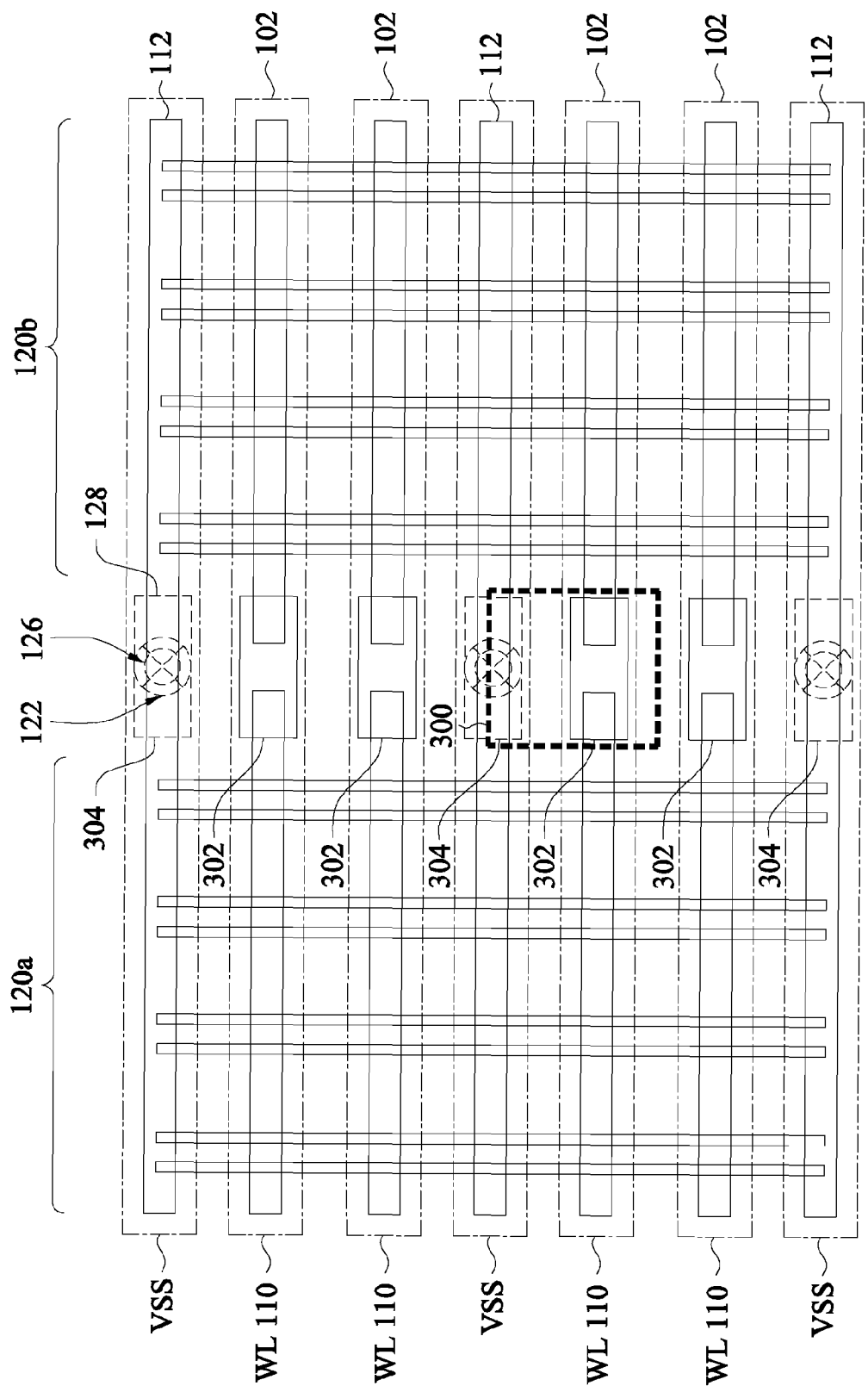

FIG. 5E illustrates a top down view of ROM array 120 in accordance with various embodiments. FIG. 5E illustrates additional features of ROM array 120 from FIGS. 5A and 5B. The dotted-lined boxes used to delineate ROM cell 100 boundaries and many strap cell 300 boundaries in FIG. 5A are removed for ease of illustration. In addition to the plurality of word lines 110 running over and parallel to gates 102, plurality of $V_{ss}$ lines runs over and parallel to isolation devices 112. The $V_{ss}$ lines may be second-level $V_{ss}$ lines 146 of FIG. 3C.

Each isolation device 112 of ROM array 120 may have an uninterrupted gate electrically connected to $V_{ss}$ by connection modules 304. As previously discussed, isolation devices 112 may be permanently in a turn-off state, and variations in voltage/current characteristics may not affect isolation devices 112 as readily. Each connection module 304 includes a gate contact 122 contacting gates of isolation device 112. Gate contact 122 is electrically connected to a first-level via 126, which is electrically connected to a first-level metal line 128. First-level metal line 128 may be a first-level $V_{ss}$ 144 of FIG. 3C. First level metal line 128 may or may not be electrically connected to second-level $V_{ss}$ lines 146 by a connection via 142 (not shown).

Figure 6:
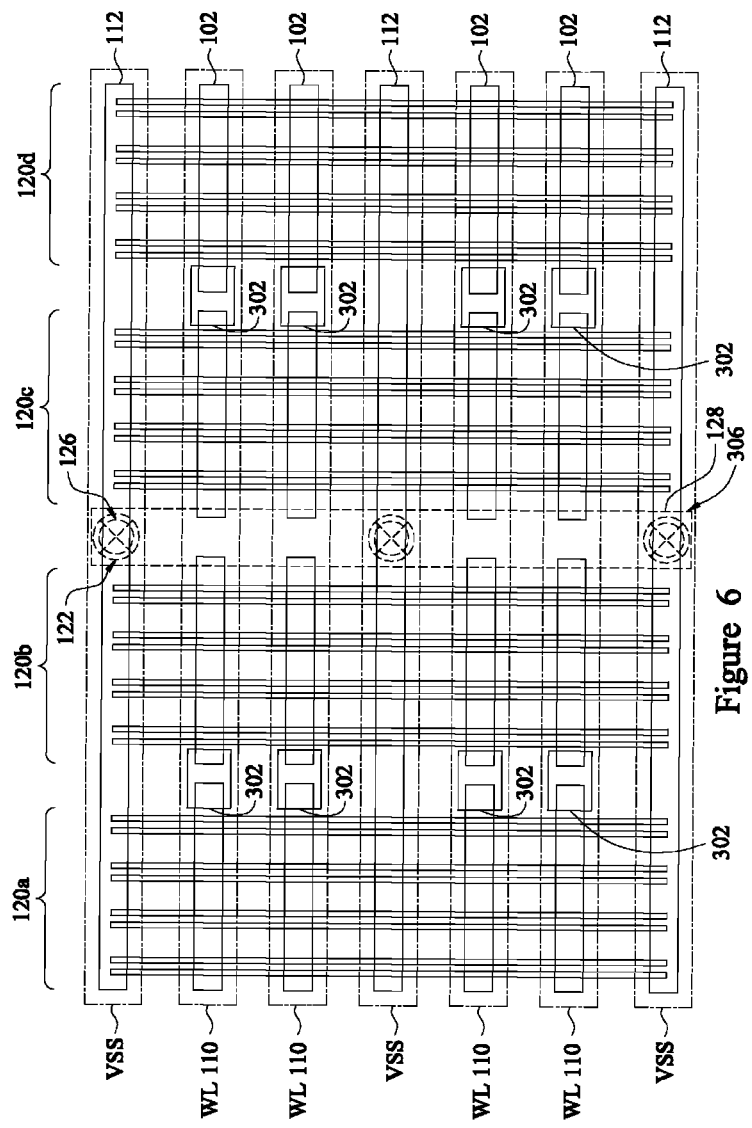
FIG. 6 is a top-down view of a ROM array according to various alternative embodiments.

FIG. 6 illustrates a top down view of ROM array 120 in accordance with various alternative embodiments. ROM array 120 includes ROM cells 100 and strap cells 300, which are unmarked in FIG. 6 for ease of illustration. Four ROM array portions 120a-120d are illustrated in FIG. 6. Gates 102 are physically separated at boundaries of each ROM array portion 120a-120d. Connection modules 302 of strap cells 300 (not shown) electrically connect physically separated gates 102 in the same ROM array row to a common word line 110. However, connection modules 302 are not disposed between every ROM array portion. For example, there are no connection modules 302 connecting gates 102 of ROM array portion 120b to gates 102 of ROM array portion 120c. Rather, gates 102 of ROM array portion 120b are electrically connected to word line 110 and gates 102 of ROM array portion 120a. Similarly, gates 102 of ROM array portion 120c are electrically connected to word line 110 and to gates 102 of ROM array portion 120d. Therefore, gates of ROM array portion 120b and 120c in the same row may be electrically connected through a common word line 110.

ROM array 120 includes isolation devices 112 having continuous gate structures. Gates of various isolation devices 112 are connected to $V_{ss}$ using a single connection module 306 disposed between ROM array portion 120b and ROM array portion 120c. Because connection modules 302 are not disposed between ROM array portions 120b and 120c, a single larger connection module 306 for connecting isolation devices to $V_{ss}$ may be located therein. Connection module 306 includes a gate contact 122 and a first-level via 126 electrically connected to a gate of each isolation device 112. Gate contacts 122 and first-level vias 126 are connected to a common first-level metal line 128. First-level metal line 128 may be a first-level $V_{ss}$ line 144 of FIG. 3C. First-level metal line 128 may or may not be connected to one or more second-level $V_{ss}$ lines 146 through a connection via 142 (not shown).

Figure 7A:
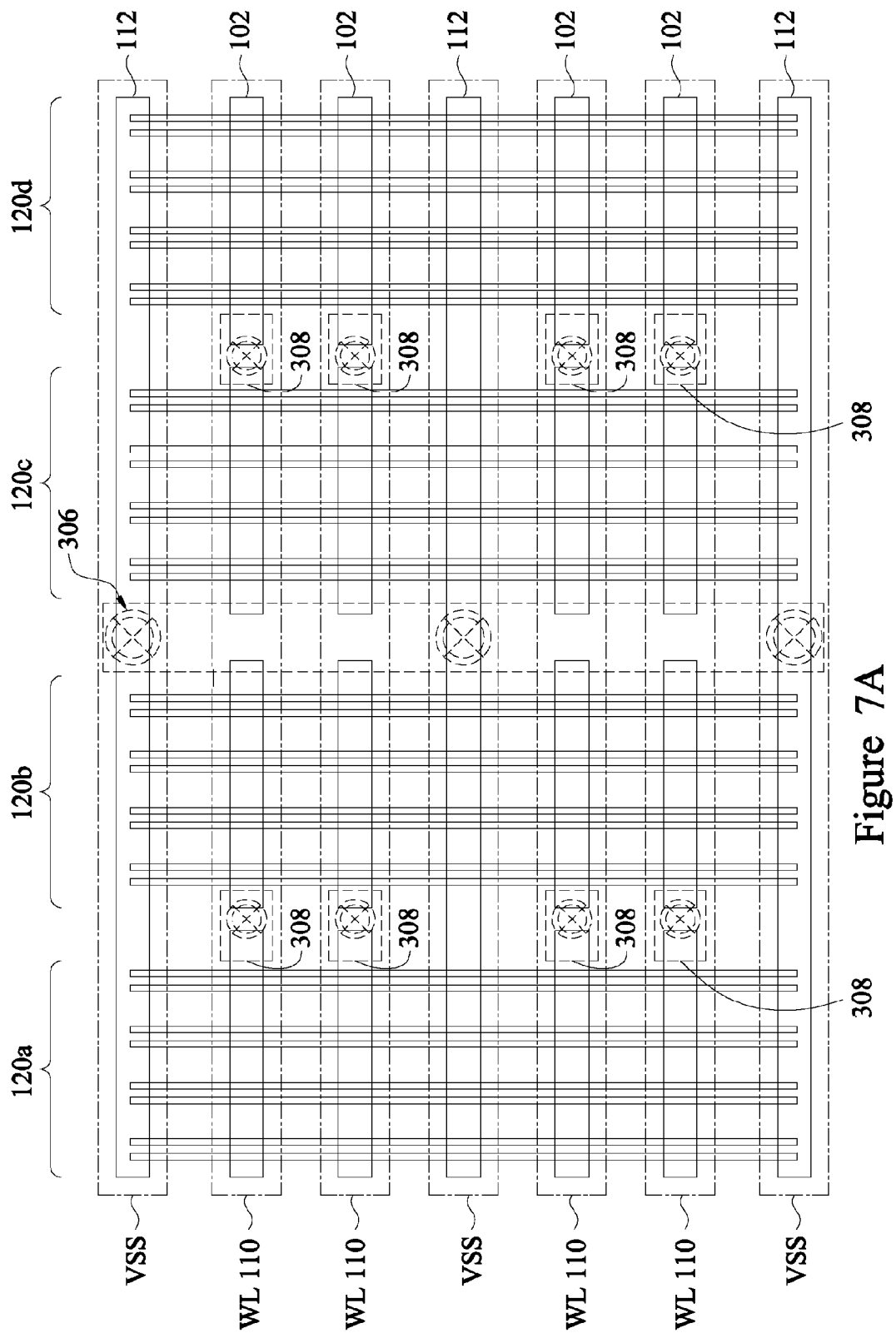
FIGS. 7a-7b are varying views of a ROM array according to various alternative embodiments.
Figure 7B:
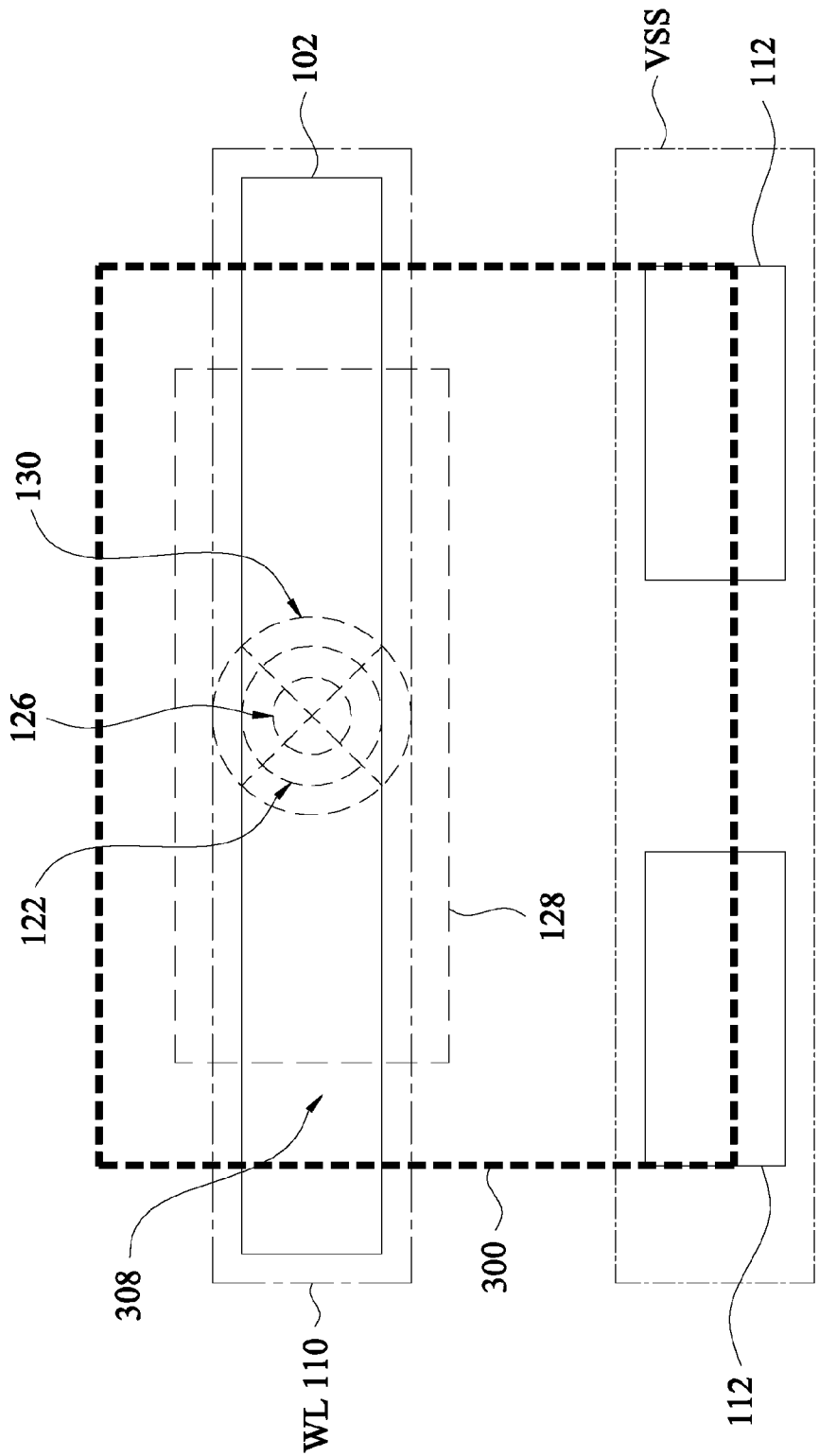

FIGS. 7A and 7B illustrate varying views of ROM array 120 in accordance with alternative embodiments. Gates 102 of ROM cells 100 (not delineated in FIG. 7A for ease of illustration) may not be physically separated between each ROM array portion 120a-120d. Similarly, isolation devices 112 may not have continuous gates. Rather, gates 102 and gates of isolation devices 112 are physically separated between alternating ROM array portions 120a-120d. Gates 102 are physically separated from ROM array portions 120b and 120c. Gates of isolation devices 112 are physically separated between ROM array portions 120a and 12b, and gates of isolation devices 112 are also physically separated between ROM array portions 120c and 120d.

Gates of multiple isolation devices 112 are connected to $V_{ss}$ using a common connection module 306 as described regarding FIG. 6. Connection module 306 is disposed between ROM array portions 120b and 120c.91.

Gates 102 in the same ROM array row are connected to a common word line 110 using connection modules 308 of strap cells 300 (see FIG. 7B) disposed between ROM array portions 120a and 120b. Connection modules 308 are also disposed between ROM array portions 120c and 120d. Therefore, gates 102 of ROM array portions 120b and 120c in the same ROM array row are interconnected by a common word line 110 despite the lack of connection modules between ROM array portions 120b and 120c. Notably, connection modules 308 are disposed over a continuous region of gates 102, not regions where gates 102 are physically separated. Therefore, the layout footprint of connection modules 308 may be relatively small.

FIG. 7B illustrates a top-down detailed view of a strap cell 300 in accordance with various embodiments illustrated in FIG. 7A. Strap cell 300 includes a continuous gate structure 102 and physically separated gates of isolation device 112. Connection module 308 electrically connects gate 102 to a word line 110. Gate 102 may share a common word line 110 with other gates 102 in the same ROM array row. Word line 110 may be a second-level metal line 132 of FIGS. 3A and 3B.

Connection module 308 includes a gate contact 122 contacting gates 102. Gate contact 122 is electrically connected to a first-level via 126. First-level via 126 is electrically connected to a first-level metal line 128. First-level metal line 128 is electrically connected to word line 110 using a second-level via 130.

While FIG. 6-7B illustrate vias 126 and 130 as being vertically aligned, this is not necessary. One skill in the art would recognize that vias 126 and 130 may also be arranged to be laterally spaced from one another without departing from the scope of various embodiments.

Figure 8:
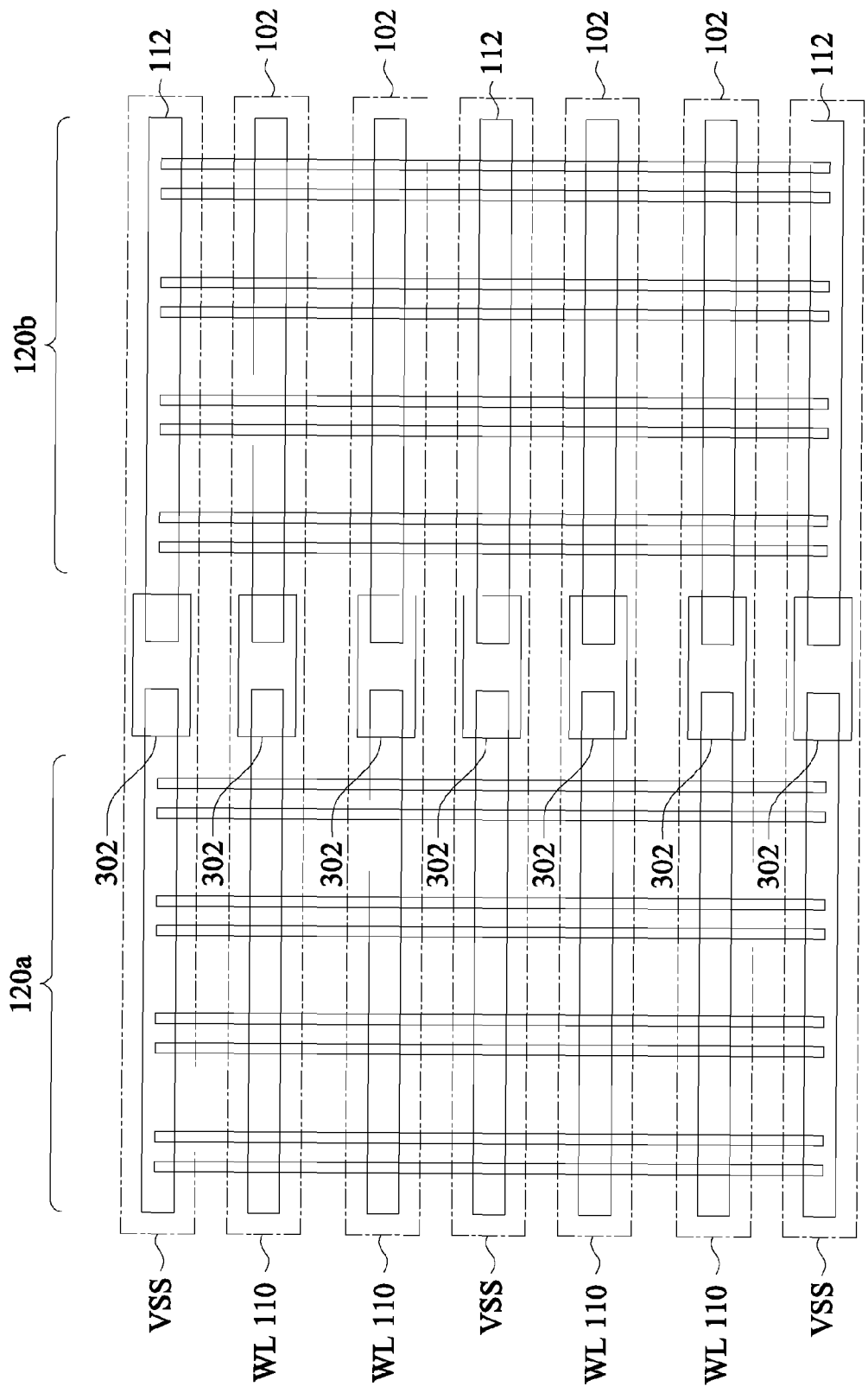
FIG. 8 is a top-down view of a ROM array according to various alternative embodiments.

FIG. 8 illustrates a top-down view of ROM array 120 in accordance with alternative embodiments. The ROM array layout illustrated in FIG. 8 is similar to the layout illustrated in FIG. 5E. However, gates of isolation devices 112 are physically separated in the same manner as gates 102 (i.e., between ROM array portions 120a and 120b). Gates 102 and gates of isolation devices 112 are electrically connected to $V_{ss}$ using connection modules 302. In depth detail of connection modules 302 may be found, for example, in FIGS. 5C and 5D.

In accordance with an embodiment, an integrated circuit (IC) chip includes first and second ROM cells arranged in a same row of a ROM array. The first and second ROM cells include first portions of first and second gate structures, respectively. The IC chip further includes a strap cell disposed between the first and second ROM cells. The strap cell includes second portions of the first and second gate structures. The first gate structure is physically separated from the second gate structure.

In accordance with another embodiment, an integrated circuit (IC) chip includes a read-only-memory (ROM) array having a plurality of rows of ROM cells. Each of the plurality of rows of ROM cells includes a plurality of physically separated gate structures. Lengths of the plurality of physically separated gate structures are substantially uniform. Each of the plurality of rows further includes a plurality of connection modules electrically connecting each of the plurality of gate structures to a common word line.

In accordance with yet another embodiment, a method includes providing a read-only-memory (ROM) array. The ROM array includes a plurality of rows. Each plurality of rows includes a plurality of ROM bit cells. The plurality of ROM bit cells each include a gate. The method further includes physically separating gates of the plurality of ROM bit cells at regular intervals.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the various connection modules and layouts presented for various ROM arrays may be combined, interchanged, and/or modified without departing from the scope of the disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit (IC) chip comprising:
a read-only-memory (ROM) array comprising a plurality of rows of ROM cells, wherein each row of the plurality of rows of ROM cells comprises:
a plurality of physically separated gate structures, wherein respective lengths of each of the plurality of physically separated gate structures are substantially uniform, and wherein each row of the plurality of rows runs in a direction substantially parallel to a lengthwise direction of each of the plurality of physically separated gate structures; and
a plurality of first connection modules electrically connecting each of the plurality of physically separated gate structures to a common word line.

2. The IC chip of claim 1, wherein the each of the plurality of physically separated gate structures span four, eight, sixteen, thirty-two, or sixty-four ROM cells.

3. The IC chip of claim 1, wherein the plurality of first connection modules are disposed over and contact continuous areas the plurality of gate structures.

4. The IC chip of claim 1, wherein the plurality of first connection modules are disposed over separated areas of the plurality of gate structures, wherein each of the plurality of first connection modules contact two physically separated and adjacent ones of the plurality of gate structures.

5. The IC chip of claim 1, wherein the ROM array further comprises a plurality of isolation devices disposed between the plurality of rows, and wherein gates of the plurality of isolation devices are electrically connected to ground potential.

6. The IC chip of claim 5, wherein the ROM array further comprises a second connection module electrically connecting the gates of the plurality of isolation devices to a common ground line.

7. The IC chip of claim 5, wherein gates of a first row of isolation devices of the plurality of isolation devices are physically connected together.

8. The IC chip of claim 5, wherein gates of a first row of isolation devices of the plurality of isolation devices are physically separated.

9. A method comprising:
providing a read-only-memory (ROM) array comprising a row comprising a plurality of ROM bit cells, the plurality of ROM bit cells each comprising a gate, wherein the row runs in a direction substantially parallel to a lengthwise direction of gates of the plurality of ROM bit cells; and
physically separating the gates of the plurality of ROM bit cells in the row at regular intervals.

10. The method of claim 9, further comprising electrically connecting physically separated gates of the plurality of ROM bit cells to a common word line.

11. The method of claim 10, wherein electrically connecting the physically separated gates comprises disposing a connection module on a continuous area on each of the physically separated gates.

12. The method of claim 10, wherein electrically connecting the physically separated gates comprises disposing a connection module over a first gate and a second gate of the physically separated gates, wherein the connection module is coupled to both the first gate and the second gate.

13. The method of claim 9, wherein physically separating gates of the plurality of ROM bit cells at regular intervals comprises physically separating gates of the plurality of ROM bit cells at every four, eight, sixteen, thirty-two, or sixty-four ROM bit cells.

14. A read-only-memory (ROM) array comprising:
a first row comprising a plurality of physically separated first gate structures, wherein each of the plurality of physically separated first gate structures is electrically connected to a first word line, and wherein the first row runs in a direction substantially parallel to a lengthwise direction of the plurality of physically separated first gate structures; and
a second row comprising a plurality of physically separated second gate structures, wherein each of the physically separated second gate structures is electrically connected to a second word line, wherein the second row is substantially parallel to the first row, and wherein lengths of each of the plurality of physically separated first gate structures and each of the plurality of physically separated second gate structures are substantially uniform.

15. The ROM array of claim 14 further comprising a connection module electrically connecting a first one of the plurality of physically separated first gate structures to the first word line.

16. The ROM array of claim 15, wherein the connection module is disposed on a continuous area of the first one of the plurality of physically separated first gate structures.

17. The ROM array of claim 15, wherein the connection module further electrically connects a second one of the plurality of physically separated first gate structures to the first word line.

18. The ROM array of claim 17, wherein the connection module comprises a first gate contact disposed on both the first one and the second one of the physically separated first gate structures.

19. The ROM array of claim 17, wherein the connection module comprises:
a first gate contact disposed on the first one of the physically separated first gate structures; and
a second gate contact disposed on the second one of the physically separated first gate structures.

20. The ROM array of claim 14 further comprising a third row comprising one or more third gate structures electrically connected to ground potential, wherein the third row is disposed between the first row and the second row.

* * * * *